United States Patent
Chan et al.

(10) Patent No.: US 8,272,609 B2
(45) Date of Patent: Sep. 25, 2012

(54) HEAT SINK BRACKET

(75) Inventors: Hung-Chou Chan, Taipei Hsien (TW); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co. Ltd., Tu-Cheng, New Taipei (TW)

( * ) Notice: Subject to any disclaimer, the term of this patent is extended or adjusted under 35 U.S.C. 154(b) by 72 days.

(21) Appl. No.: 12/916,607

(22) Filed: Oct. 31, 2010

(65) Prior Publication Data

US 2012/0074077 A1    Mar. 29, 2012

(30) Foreign Application Priority Data

Sep. 23, 2010    (CN) .......................... 2010 1 0289267

(51) Int. Cl.
*A47F 5/00*    (2006.01)
(52) U.S. Cl. ................ 248/298.1; 248/220.22; 248/245; 410/104; 403/257
(58) Field of Classification Search ............... 248/298.1, 248/220.22, 245; 410/104; 403/257
See application file for complete search history.

(56) References Cited

U.S. PATENT DOCUMENTS

| | | | | |
|---|---|---|---|---|
| 2,767,951 A * | 10/1956 | Cousino | ........................ | 248/245 |
| 3,901,612 A * | 8/1975 | Canin | ........................... | 403/189 |
| 4,364,500 A * | 12/1982 | Bott | ............................... | 224/325 |
| 5,520,316 A * | 5/1996 | Chen | ............................... | 224/539 |
| 5,695,078 A * | 12/1997 | Otema | ........................... | 211/103 |
| 5,779,412 A * | 7/1998 | Nagai et al. | ..................... | 411/85 |
| 6,086,300 A * | 7/2000 | Frohlich | .......................... | 411/84 |
| 6,260,813 B1 * | 7/2001 | Whitcomb | ................. | 248/503.1 |
| 6,307,747 B1 * | 10/2001 | Farnsworth et al. | .......... | 361/704 |
| 6,827,320 B2 * | 12/2004 | Yeh | .......................... | 248/220.22 |
| 7,044,701 B2 * | 5/2006 | Herb | ............................... | 411/84 |
| 7,070,156 B2 * | 7/2006 | Liao | .............................. | 248/466 |
| 7,190,591 B2 * | 3/2007 | Peng et al. | ..................... | 361/719 |
| 7,320,452 B2 * | 1/2008 | Chen | .......................... | 248/227.1 |
| 7,460,372 B2 * | 12/2008 | Liao et al. | ...................... | 361/704 |
| 7,573,716 B2 * | 8/2009 | Sun et al. | ....................... | 361/719 |
| 8,009,428 B1 * | 8/2011 | Ye | .................................. | 361/710 |
| 8,011,635 B2 * | 9/2011 | Aleo | .............................. | 248/476 |
| 8,100,600 B2 * | 1/2012 | Blum | .............................. | 403/256 |
| 2003/0159819 A1 * | 8/2003 | Lee | ................................ | 165/185 |
| 2007/0047211 A1 * | 3/2007 | Refai-Ahmed et al. | ....... | 361/720 |
| 2011/0242738 A1 * | 10/2011 | Ye | .............................. | 361/679.01 |
| 2011/0260026 A1 * | 10/2011 | Ye et al. | ..................... | 248/298.1 |
| 2012/0024495 A1 * | 2/2012 | Chen et al. | ....................... | 165/67 |

* cited by examiner

*Primary Examiner* — Terrell McKinnon
*Assistant Examiner* — Daniel J Breslin
(74) *Attorney, Agent, or Firm* — Altis Law Group, Inc.

(57) ABSTRACT

A bracket for mounting a heat sink on a printed circuit board includes two supports, two rails slidably attached to the supports, four adjusting assemblies slidably attached to the rails and four positioning members extending through the supports to engage with the rails to position the rails on the supports. Positions of opposite ends of the rails in the supports are adjustable along a first direction. Each of the rails defines two spaced slide slots in opposite ends of the rail. The supports and the rails are attached to a first side of the printed circuit board. Positions of the adjusting assemblies in the slide slots are adjustable along a second direction perpendicular to the first direction. The adjusting assemblies extend through the circuit board to engage with the heat sink at a second side of the printed circuit board.

6 Claims, 5 Drawing Sheets

HEAT SINK BRACKET

CROSS-REFERENCE OF RELATED APPLICATION

A relevant subject matter is disclosed in a co-pending U.S. patent application Ser. No. 12/889,422 entitled "MOUNTING APPARATUS FOR BLOWER", which is assigned to the same assignee as named herein.

BACKGROUND

1. Technical Field

The present disclosure relates to a bracket for mounting a heat sink on a printed circuit board.

2. Description of Related Art

Generally, on a motherboard, there is a heat sink mounted on an electronic element, such as a central processing unit (CPU), to dissipate heat from the electronic element. However, heat sinks are relatively large and heavy, making them unwieldy and difficult to mount on a motherboard, and the heat sink may damage the motherboard due to mechanical overloading. Therefore, there is an increasing need to distribute the force that is created by the heat sink on the motherboard to minimize load conditions that could damage the motherboard. Therefore, a plate is invented for reinforcing the motherboard. However, motherboards come in many configurations and so no one type of plate can be used for many different motherboards.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
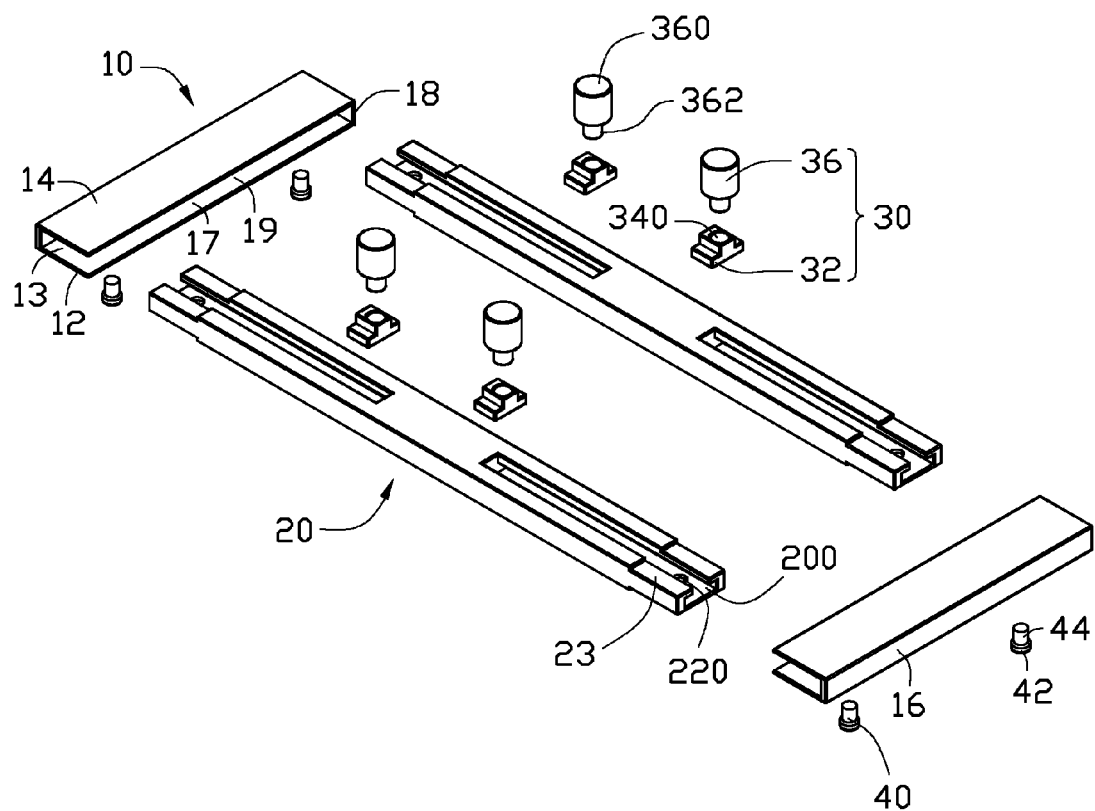
FIG. 1 is an exploded, isometric view of an exemplary embodiment of a bracket for mounting a heat sink on a printed circuit board.
Figure 2:
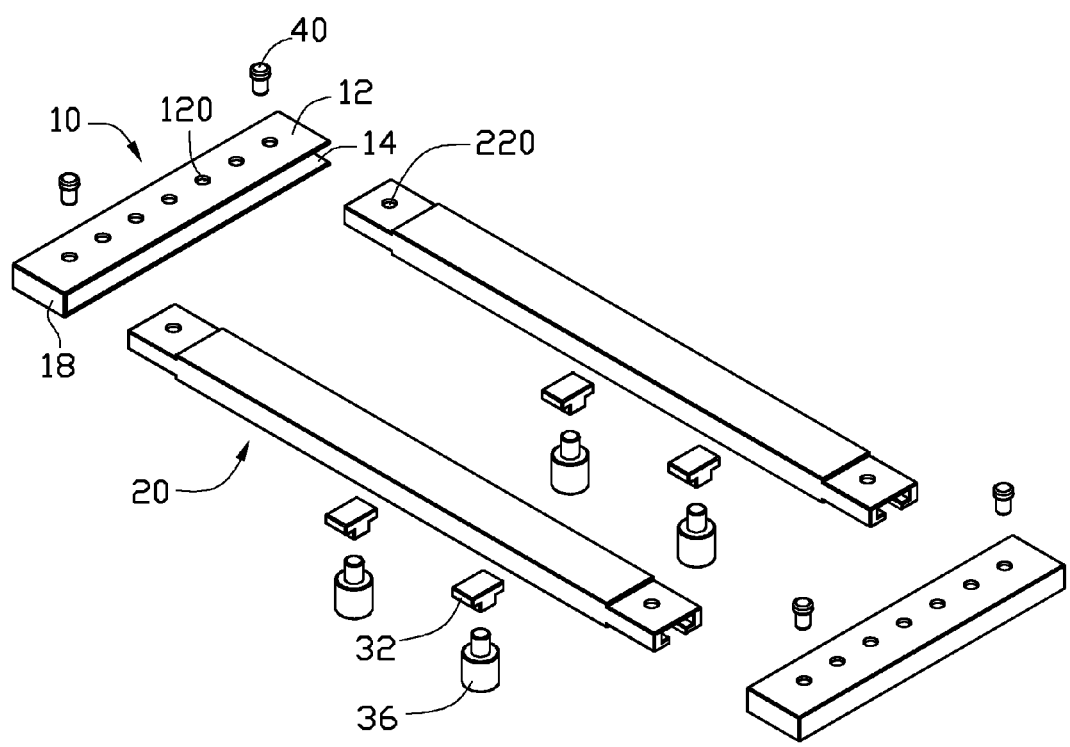
FIG. 2 is an inverted view of the bracket of FIG. 1.
Figure 5:
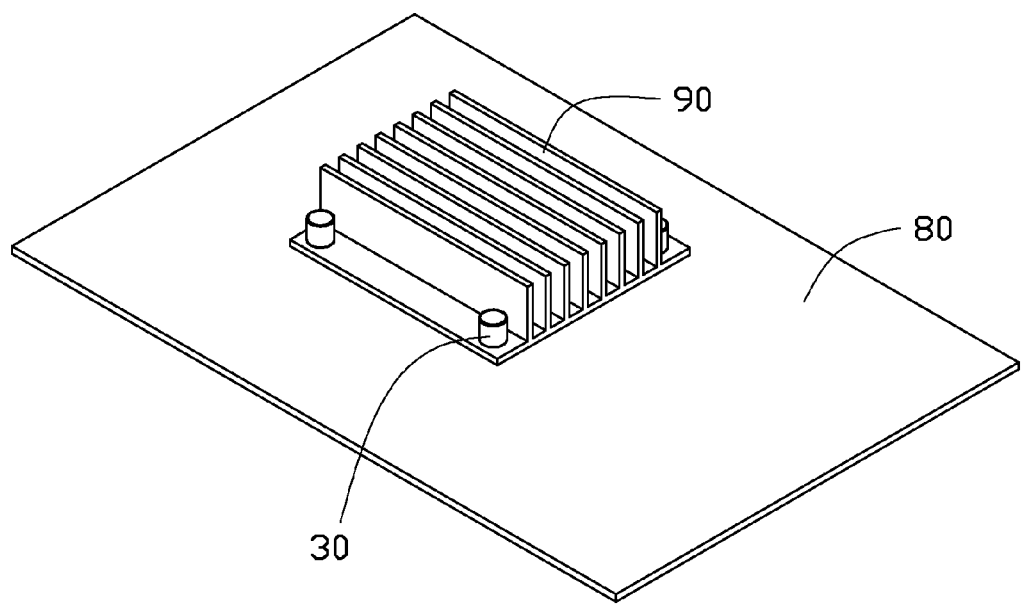
FIG. 5 is an inverted view of the bracket of FIG. 4.

Referring to FIGS. 1, 2, and 5, an exemplary embodiment of a bracket for mounting a heat sink 90 on a printed circuit board 80, such as a motherboard, includes two supports 10, two rails 20, two adjusting assemblies 30, and four positioning members 40.

Each support 10 includes a rectangular bottom wall 12, a top wall 14 opposite and parallel to the bottom wall 12, a sidewall 16 perpendicularly connected between corresponding sides of the top and bottom walls 14 and 12, and an end wall 18 perpendicularly connected between corresponding ends of the top and bottom walls 14 and 12. A receiving space 19 is bounded by the top and bottom walls 14 and 12, the sidewall 16, and the end wall 18. A first opening 17 communicating with the receiving space 19 is defined among the end wall 18, and the top and bottom walls 14 and 12, opposite to the sidewall 16. A second opening 13 communicating with the receiving space 19 is defined among the sidewall 16, and the top and bottom walls 14 and 12, opposite to the end wall 18. A number of first positioning holes 120 are defined in the bottom wall 12.

Each rail 20 is bar-shaped and includes two elongated recessed engaging portions 23 formed at opposite ends of the rail 20. Two spaced slide slots 200 are respectively defined in the opposite ends of the rail 20. The slots 200 are T-shaped in cross section and extend through the corresponding ends of the rail 20. Two second positioning holes 220 are respectively defined in bottom walls bounding the slide slots 200, adjacent to the corresponding ends of the rail 20.

Each adjusting assembly 30 includes a substantially T-shaped block 32 and a fastener 36. A threaded hole 340 is defined in the block 32. In this embodiment the fastener 36 is a screw and includes a head 360, and a threaded post 362.

Each positioning member 40 includes a head 42 and a post 44.

Figure 3:
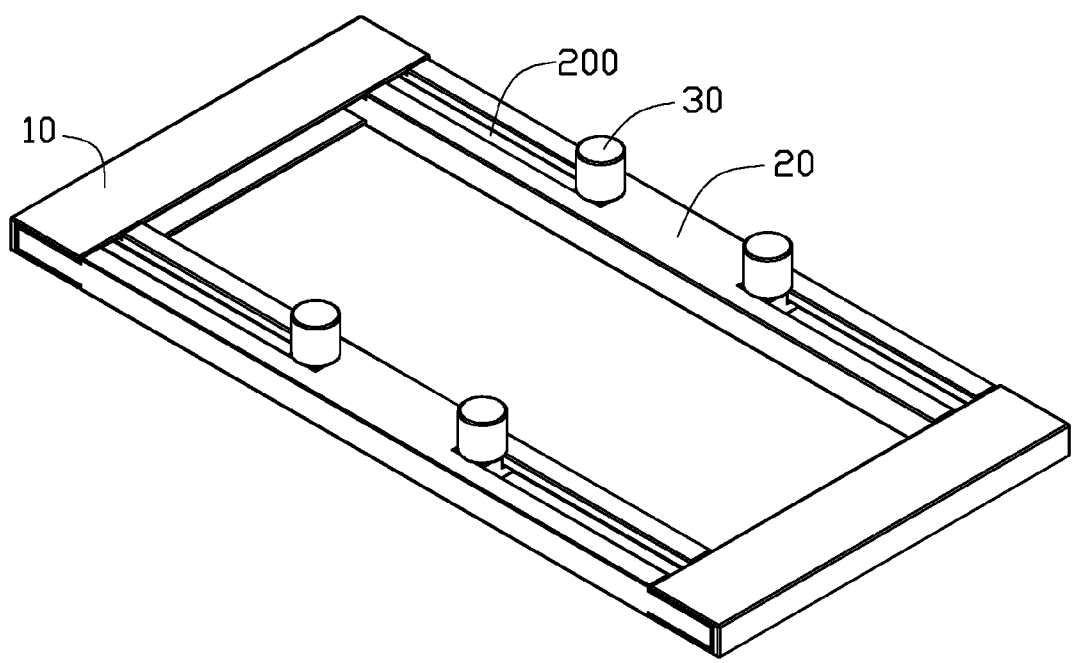
FIG. 3 is an assembled, isometric view of the bracket of FIG. 1.

Referring to FIG. 3, in assembly, the blocks 32 of the adjusting assemblies 30 are respectively entered into the corresponding slide slots 200. Sizes of the blocks 32 and the slide slots 200 are correspondingly designed to prevent the blocks 32 from sliding out of the rail 20 from the slide slots 200. The blocks 32 can slide in the corresponding slide slots 200. The threaded posts 362 of the fasteners 36 are engaged in the threaded holes 340 of the corresponding blocks 32, and the heads 360 of the fasteners 36 resist against the tops of the rails 20, thereby the blocks 32 are fixed to the rails 20.

The rails 20 are attached to the supports 10, with the recessed engaging portions 23 of the rails 20 entering the receiving space 19 of the supports 10 through the second openings 13 or the first openings 17. The posts 44 of the positioning members 40 extend through the corresponding first positioning holes 120 of the supports 10 to engage in the corresponding second positioning holes 220 of the rails 20, and the heads 42 of the positioning members 40 resist against the bottom sidewall 12 of the supports 10 to position the rails 20 at the supports 10.

Figure 4:
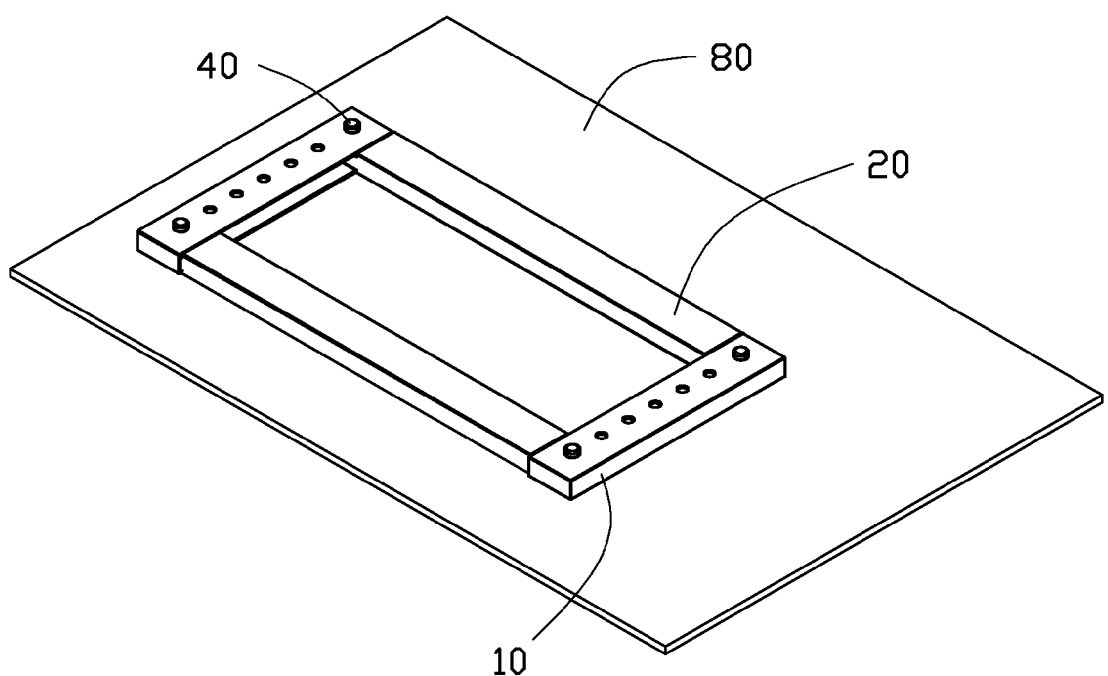
FIG. 4 shows a use state of the bracket of FIG. 3.

Referring to FIGS. 4 and 5, in use, the fasteners 36 and the positioning members 40 are disassembled from the blocks 32 and the supports 10. The supports 10 and the rails 20 are attached to a first side of the motherboard 80. The engaging portions 23 of the rails 20 are slid into the receiving space 19, with the second positioning holes 220 of the rails 20 aligning with corresponding first positioning holes 120 of the supports 10 according to a size of the heat sink 90. The blocks 32 are slid in the corresponding slide slots 200 to corresponding positions of the rails 20 according to the size of the heat sink 90. The heat sink 90 is attached to a second side of the motherboard 80 opposite to the first side, with through holes (not labeled) defined in the heat sink 90 aligning with the threaded holes 340 of the blocks 32. The posts 362 of the fasteners 36 extend through the through holes of the heat sink 90 and corresponding through holes of the motherboard 80, and are engaged in the threaded holes 340 of the blocks 32, with the heads 360 of the fasteners 36 firmly resisting against the heat sink 90. Finally, the posts 44 of the positioning members 40 are extended through the first positioning holes 120 of the supports 10 to engage in the second positioning holes 220 of the rails 20, with the heads 42 of the positioning members 40 firmly resisting against the bottom wall 12 of the supports 10.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A bracket for mounting a heat sink on a printed circuit board, the bracket comprising:

two supports;

two rails mounted between the supports, opposite ends of each of the rails received in the corresponding supports and slidable along a first direction in which each of the supports extends, each of the rails defining two slide slots each extending through one of the opposite ends of the rail and extending along the rail, wherein the supports and the rails are attached to a first side of the printed circuit board;

four positioning members extending through the supports to engage with the rails to position the rails on the supports; and four adjusting assemblies respectively attached to the slide slots of the rails, the adjusting assemblies are adjustably received in the corresponding slide slots along a second direction substantially perpendicular to the first direction, wherein the adjusting assemblies are to extend through the circuit board to engage with the heat sink at a second side of the printed circuit board opposite the first side;

wherein each of the supports comprises a rectangular bottom wall, a top wall opposite and parallel to the bottom wall, a sidewall substantially perpendicularly connected between corresponding sides of the top and bottom walls, and an end wall substantially perpendicularly connected between corresponding ends of the top and bottom walls, a receiving space is bounded by the top wall, bottom wall, sidewall, and end wall, the corresponding ends of the rails are received in the receiving spaces of the supports;

wherein the opposite ends of each of the rails comprise two recessed engaging portions to be received in the supports.

2. The bracket of claim 1, wherein a plurality of first positioning holes is defined in the bottom wall of each support, two second positioning holes are defined in the ends of each rail, the positioning members extend through the first positioning holes to engage in the second positioning holes.

3. The bracket of claim 1 wherein each of the slide slots is substantially T-shaped in cross section.

4. The bracket of claim 3, wherein each of the adjusting assemblies comprises a substantially T-shaped block slidably engaging in the slide slots.

5. The bracket of claim 4, wherein each of the adjusting assemblies further comprises a fastener, the fastener comprises a post and a head, a threaded hole is defined in each block, the post of the fastener extends through the heat sink to engage in the threaded hole, and the head of the fastener abuts against the heat sink.

6. A bracket for mounting a heat sink on a printed circuit board, the bracket comprising:

two supports;

two rails mounted between the supports, opposite ends of each of the rails received in the corresponding supports and slidable along a first direction in which each of the supports extends, each of the rails defining two slide slots each extending through one of the opposite ends of the rail and extending along the rail, wherein the supports and the rails are attached to a first side of the printed circuit board;

four positioning members extending through the supports to engage with the rails to position the rails on the supports; and four adjusting assemblies respectively attached to the slide slots of the rails, the adjusting assemblies are adjustably received in the corresponding slide slots along a second direction substantially perpendicular to the first direction, wherein the adjusting assemblies are to extend through the circuit board to engage with the heat sink at a second side of the printed circuit board opposite to the first side;

wherein each of the supports comprises a rectangular bottom wall, a top wall opposite and parallel to the bottom wall, a sidewall substantially perpendicularly connected between corresponding sides of the top and bottom walls, and an end wall substantially perpendicularly connected between corresponding ends of the top and bottom walls, a receiving space is bounded by the top wall, bottom wall, sidewall, and end wall, the corresponding ends of the rails are received in the receiving spaces of the supports; and wherein a plurality of first positioning holes is defined in the bottom wall of each support, two second positioning holes are defined in the ends of each rail, the positioning members extend through the first positioning holes to engage in the second positioning holes.

* * * * *